United States Patent
Hoogenboom et al.

(10) Patent No.: US 9,378,921 B2
(45) Date of Patent: Jun. 28, 2016

(54) INTEGRATED OPTICAL AND CHARGED PARTICLE INSPECTION APPARATUS

(71) Applicant: DELMIC B.V., Delft (NL)

(72) Inventors: Jacob Pieter Hoogenboom, Delft (NL); Aernout Christiaan Zonnevylle, Delft (NL); Pieter Kruit, Delft (NL); Angela Carolina Narváez-González, Delft (NL)

(73) Assignee: DELMIC B.V., Delft (NL)

( * ) Notice: Subject to any disclaimer, the term of this patent is extended or adjusted under 35 U.S.C. 154(b) by 0 days.

(21) Appl. No.: 14/428,163

(22) PCT Filed: Sep. 16, 2013

(86) PCT No.: PCT/NL2013/050669
§ 371 (c)(1),
(2) Date: Mar. 13, 2015

(87) PCT Pub. No.: WO2014/042538
PCT Pub. Date: Mar. 20, 2014

(65) Prior Publication Data
US 2015/0262784 A1 Sep. 17, 2015

(30) Foreign Application Priority Data

Sep. 14, 2012 (NL) .................................... 1039803
Mar. 19, 2013 (NL) .................................... 1040108

(51) Int. Cl.
*H01J 37/28* (2006.01)
*H01J 37/21* (2006.01)
(Continued)

(52) U.S. Cl.
CPC ............. *H01J 37/023* (2013.01); *H01J 37/222* (2013.01); *H01J 37/228* (2013.01); *H01J 37/28* (2013.01);
(Continued)

(58) Field of Classification Search
CPC .......... H01J 37/28; H01J 37/228; H01J 37/06; H01J 37/023; H01J 37/21; H01J 37/22; G01N 23/225; G01N 23/2206
USPC .......................... 250/310, 492.3, 311; 438/14; 356/237.3; 359/368, 385, 391
See application file for complete search history.

(56) References Cited

U.S. PATENT DOCUMENTS 4,537,477 A * 8/1985 Takagi ................. G02B 21/002
250/310
(Continued)

FOREIGN PATENT DOCUMENTS

EP 752715 5/2001
FR 2792065 10/2000
(Continued)

OTHER PUBLICATIONS

Wouters C H et al: "Specimen stage incorporating light microscopical optics for a Cambridge S180 scanning electron microscope", Journal of Microscopy, Blackwell Science, vol. 145, No. 2, Feb. 1, 1987, pp. 237-240, XP009144791, ISSN: 0022-2720.
(Continued)

*Primary Examiner* — David A Vanore
(74) *Attorney, Agent, or Firm* — Stephen H. Eland; Dann, Dorfman, Herrell & Skillman

(57) ABSTRACT

The present invention relates to a method for mutually aligning a scanning electron microscope SEM and a light microscope LM by creating a change (61) in the detected light signal of the light microscope LM by illuminating a substrate with an electron beam, correlating the position of the electron beam in the coordinate system of the scanning electron microscope SEM to the position of the observed change in the detected light signal in the coordinate system of the light microscope LM, and relatively shifting the scanning electron microscope SEM and the light microscope LM with respect to one another to a desired relative position of the coordinate systems (60, 62).

18 Claims, 9 Drawing Sheets

(51) Int. Cl.
*H01J 37/02* (2006.01)
*H01J 37/22* (2006.01)

(52) U.S. Cl.
CPC .... *H01J 2237/221* (2013.01); *H01J 2237/2482* (2013.01); *H01J 2237/2801* (2013.01); *H01J 2237/2808* (2013.01)

(56) References Cited

U.S. PATENT DOCUMENTS

| | | | | |
|---|---|---|---|---|
| 5,483,065 A * | 1/1996 | Sato | ................ | H01J 37/256 250/310 |
| 5,614,713 A * | 3/1997 | Kobaru | ................ | H01J 37/22 250/310 |
| 5,747,816 A * | 5/1998 | Kurosaki | ................ | B82Y 10/00 250/491.1 |
| 6,067,153 A * | 5/2000 | Mizuno | ................ | G01N 23/225 356/237.2 |
| 6,169,282 B1 * | 1/2001 | Maeda | ................ | G01R 31/311 250/307 |
| 6,552,341 B1 | 4/2003 | Desplats et al. | | |
| 6,792,359 B2 * | 9/2004 | Ninomiya | ................ | G01N 21/9501 702/33 |
| 2002/0142496 A1 * | 10/2002 | Nakasuji | ................ | G01N 23/225 438/14 |
| 2012/0274931 A1 * | 11/2012 | Otani | ................ | G01N 21/21 356/237.3 |
| 2013/0284924 A1 * | 10/2013 | Mizuochi | ................ | G01N 23/2206 250/310 |
| 2015/0276622 A1 * | 10/2015 | Otani | ................ | G01N 21/9501 356/237.5 |

FOREIGN PATENT DOCUMENTS

| | | |
|---|---|---|
| JP | H09-283073 | 10/1997 |
| WO | 2012/008836 | 1/2012 |

OTHER PUBLICATIONS

International Search Report issued in PCT/NL13/50669 on Dec. 3, 2013.
Brown et al: "The Use of Markers for Correlative Microscopy", Protoplasma, vol. 244, 2010, pp. 91-94.

* cited by examiner

US 9,378,921 B2

INTEGRATED OPTICAL AND CHARGED PARTICLE INSPECTION APPARATUS

PRIORITY APPLICATIONS

This application is a U.S. National Stage of International Application No. PCT/NL2013/050669 filed on Sep. 16, 2013 which claims benefit and priority of NL Patent Application Nos. 1039803 filed Sep. 14, 2012 and 1/040,108 filed Mar. 19, 2013. The entire disclosure of each of the foregoing applications is hereby incorporated herein by reference.

BACKGROUND OF THE INVENTION

1. Field of the Invention

The present invention relates to an improvement in a so-called integrated inspection apparatus, featuring the integration of a scanning electron microscope (SEM) and light microscope optics. The improvement in particular relates to extension in functionality of such integrated systems, amongst others towards a new and simplified method of operating such systems.

In this respect, it is noted that information obtained from images with light microscopy and electron microscopy is to a large extent complementary. With a light microscope different objects can be seen and inspected in a specimen in different colors, which allows for identification of part or whole of the composition of this specimen. Instead of directly observing color from a constituent of the specimen, very often specific color markers are attached, such as fluorophores or autofluorescent proteins, to a specific non-colored constituent for identification.

With an electron microscope, all constituents of a specimen can be imaged at very small detail (high resolution), much smaller than with a light microscope, but the ability to identify constituents based on color is absent. In correlative light-electron microscopy, therefore, users try to obtain images from the same area of a specimen, the so called Region of Interest or ROI for short, with both the light and the electron microscope. A very accurate and quick way of doing this, is by using an integrated microscope wherein both types of microscope or parts thereof are to a more or less integrated extend contained in a single apparatus.

When dealing with two different optical systems, like the present light and electron microscope, that are meant to image the same position simultaneously or shortly after each other, a method is needed to align the systems with respect to each other. Not doing this will result in imaging different parts of the sample with the different optical systems. In the case of a scanning electron microscope an alternative would be to use beam shift, i.e. electronically shift the electron beam over the sample. However, this will introduce aberrations that will increase the electron beam probe, decreasing its resolving power. This is unwanted. For the light optical system we can go under an angle through the optical system to image the correct position in space. Unfortunately this will also decrease the optical resolving power of the light optical system. Methods are needed to align both systems to each other to have the same image centers while obtaining the optimal resolutions.

2. Description of the Related Art

Such an integrated system is known in the art, e.g. from the short technical note "Specimen stage incorporating light microscopical optics for a Cambridge S180 scanning electron microscope" by Wouters et al in J. of Microscopy Vol. 145, February 1987, pages 237-240. Recent improvements of that principle are provided by Applicant in patent publication WO2012008836 and is in line with the present invention generally described as an inspection apparatus provided with an optical microscope and an ion- or electron microscope, equipped with a source for emitting a primary beam of charged particles to a sample in a sample holder. The apparatus comprises a detector for detection of secondary charged particles backscattered from the sample and induced by the primary beam. The optical microscope is equipped with a light collecting and recording device such as a CCD camera or other light recording device, for receiving light, such as luminescence light, emitted or reflected by the sample.

In correlative microscopy, users aim to image the same area of a sample with both the light and the electron microscope. The problem in this practice is that both images have different magnification, possibly both in x and y, and a rotated orientation. Also, the images have different contrast, which means that some features that are visible in one image cannot be seen in the other, and vice versa. Known methods to overcome this problem are to put the samples on a microscope slide, or support grid, that has markers which can be recognized in both images. Another method is to inject markers into the sample, as disclosed for example in "The use of markers for Correlative Microscopy" Brown & Verkade, Protoplasma, 244, pages 91-94, 2010. In general these methods always use the patterns on a substrate which must be recognized in both images.

One of the essential points of correlative microscopy, i.e. the process of inspecting the same sample with two different investigative methods, is overlaying datasets of the two methods as precisely and accurate possible. In the case of correlative light-electron microscopy, this means an x-, y-, and occasional z-, overlay between an optical image and an electron image. The process of achieving this overlay is non-trivial and may be cumbersome.

Especially the investigation of structure-function relations in biology increasingly relies on the complementary capabilities of light- and electron microscopy. Fluorescence light microscopy is the method of choice to image and track labelled proteins inside a cell, while the electron microscope images the cellular ultrastructure at nanometer-scale resolution. Correlative light and electron microscopy (CLEM) closes the gap between light and electron microscopy by overlaying images of the same region of interest taken with both techniques. In the present subject of integrated microscopy both modalities are combined in a single embodiment. Integrated microscopy offers drastically decreased CLEM inspection times, removes the need to use specialized markers, and is less prone to errors. As such, integrated microscopes may enable widespread and high throughput application of CLEM. A crucial aspect for integrated microscopy is the ability to use both types of microscopy at their full capabilities without compromises imposed by the integration. To operate both microscopes without any compromises, especially for simultaneous imaging of the same region of interest with both modalities, mutual optical alignment of both microscopes is crucial.

BRIEF SUMMARY OF THE INVENTION

In the present invention a fundamental improvement is made in the practice of correlative microscopy, by an at hindsight relatively simple measure that obviates the specific manners for doing so as known to date. The measure according to the invention reduces complexity of correlative inspection, improves productivity and/or improves the quality and accuracy of inspection in that image. Both inspection methods can be compared simultaneously without undue complicating measures to either the apparatus or the sample.

According to a first aspect of the present invention, the measure towards obtaining these advantages involves directly determining the position of the image center of either one of the optical systems using the imaging feature of the other optical system, for locating and mutually correlating the respective image positions of the systems to a common coordinate system.

In elaboration of this principle according to the present invention, the either of both optical systems may directly image the other, or indirectly using a substrate in a substrate position in the integrated inspection system. The latter elaboration may be preferred for reason that it has the advantage that the optical system(s) do not need to move or be able to move or focus towards a location such that it is observable in the other one of the optical system(s). In this latter method, an image is acquired by scanning the e-beam while detecting the emitted light from the substrate and using this for creating a scanning image.

Using the property that the central part of most objective lenses as applied in an integrated inspection has the largest efficiency of light collection of the light optical system, the location of the maximum intensity in said scanning image of a substrate may be used to locate the light optical axis and to relate its position to the coordinate system of the electron optical system. It is remarked that a substrate used in such elaboration of the invention could in some respect optimally be a scintillator, however can as well be any material that shows cathodoluminescence, e.g. a glass material as commonly used in substrates. Impurities in such glass material will cause the substrate to show a for contemporary light optical systems sufficient level of emission as for use in detection thereof.

In an other embodiment, the invention uses the feature of a known position dependent distribution of the collection efficiency of the light optical system. This position dependent distribution is not necessarily rotationally symmetric with a maximum in the center of the image.

According to a second aspect the present invention provides a method for mutually aligning a scanning electron microscope SEM and a light microscope LM by creating a change in the detected light signal of the light microscope LM by illuminating a substrate with an electron beam;

correlating the position of the electron beam in the coordinate system of the scanning electron microscope SEM to the position of the observed change in the detected light signal in the coordinate system of the light microscope LM;

relatively shifting the scanning electron microscope SEM and the light microscope LM with respect to one another to a desired relative position of the coordinate systems.

In an embodiment, the objective lens of either one of the scanning electron microscope SEM and the light microscope LM is shifted, while the objective lens of the other system is maintained in its position.

In an embodiment, said correlation comprises the steps of making an image in which the X and Y is related to the electron beam and the signal is obtained from the light microscope LM.

According to a third aspect, the invention provides a method of aligning the optical centres of an charged particle optical inspection system and a light optical inspection system in an integrated inspection system comprising said charged particle and said light optical system for combined and preferably simultaneous inspection of a substrate, the method thereto comprising the steps of identifying and correlating the centre of the respective optical systems by imaging either system via a substrate, and mutually correlating the optical axes of the two systems in a common coordinate system.

In an embodiment, the optical microscope is included in vacuum, in particular in the vacuum space of the charged particle microscope.

In an embodiment, the light optical system is of the confocal type having a pinhole element in front of the light detection element, and wherein the method further comprising the steps of correlating the portion of the electron beam in the coordinate system of the scanning charged particle microscope and/or the light microscope to the observed change in detected light signal as a consequence of the position of the pinhole, shifting the pinhole with respect to the charged particle and/or the light microscope to a desired position.

In an embodiment, an optical image is made in which a charged particle beam or an area scanned thereby is detected, in particular using a fixed optical field of view.

In an embodiment, calibration of the integrated system, at least mutual position detection and relative displacement of the two microscopes is performed using an automated control system.

In an embodiment, mutual position detection is realized using a cathodoluminescence feature of a substrate.

In an embodiment, the shape and/or size of a light intensity profile is used for determining one or more of a position in Z-direction, an amount of Yaw and an amount of tilt.

In an embodiment, one of a charged particle microscope and a light microscope lens is directly imaged by the other microscope.

In an embodiment, the Method further comprising the step of:

generating a picture of the light intensity detected per scanned pixel in a grid correlated to either of the two optical systems;

using a spatial intensity distribution in said picture of the light collection efficiency of the light optical system to determine the spatial position of the optical axis of the light optical inspection system in respect to the optical axis of the charged particle optical inspection system.

In an embodiment, the respective axes of the light and electron optical apparatus are aligned on each other by relative tilt and yaw of the either or both of the optical axes, based on the nature of the intensity distribution.

In an embodiment, the respective optical axes of the inspection apparatuses are aligned by movement of the final optical detection element that images the substrate, either manually or automated using an electronically controlled alignment mechanism.

In an embodiment, the method comprises the step of detecting light generated in the substrate using a cathodoluminescence feature thereof.

In an embodiment, the total amount of light detected during a scan is used to position the light optical system in focus of the substrate.

In an embodiment, the light optical elements are moved to the center, i.e. optical axis of the electron beam.

According to a fourth aspect, the invention provides an apparatus for inspecting a sample, provided with a charged particle microscope having a column for producing a focused beam of charged particles to observe or modify the sample, and an optical microscope to observe a region of interest on the sample as is observed by the charged particle beam or vice versa, the apparatus accommodated with a detection and processing unit adapted and for performing a substrate scanning action for mutual correlation of the respective optical centre of the light and charged particle optical system.

In an embodiment, said adaptation comprises the performance of a relative movement of either or both of the optical systems such that the optical centers are aligned.

In an embodiment, a pinhole element is incorporated moveably in front of the final lens of the optical microscope.

The various aspects and features described and shown in the specification can be applied, individually, wherever possible. These individual aspects, in particular the aspects and features described in the attached dependent claims, can be made subject of divisional patent applications.

In addition to the above described solution relating to intensity profile collection of the light optical system, alternative embodiments including pole-piece imaging, SEM image of light objective lens and misalignment measurement with deflection settings of SEM are elaborated upon in description along the following set of figures.

BRIEF DESCRIPTION OF THE DRAWINGS

The invention will be elucidated on the basis of an exemplary embodiment shown in the attached drawings, in which.

DESCRIPTION OF ILLUSTRATIVE EMBODIMENTS

Figure 1A:
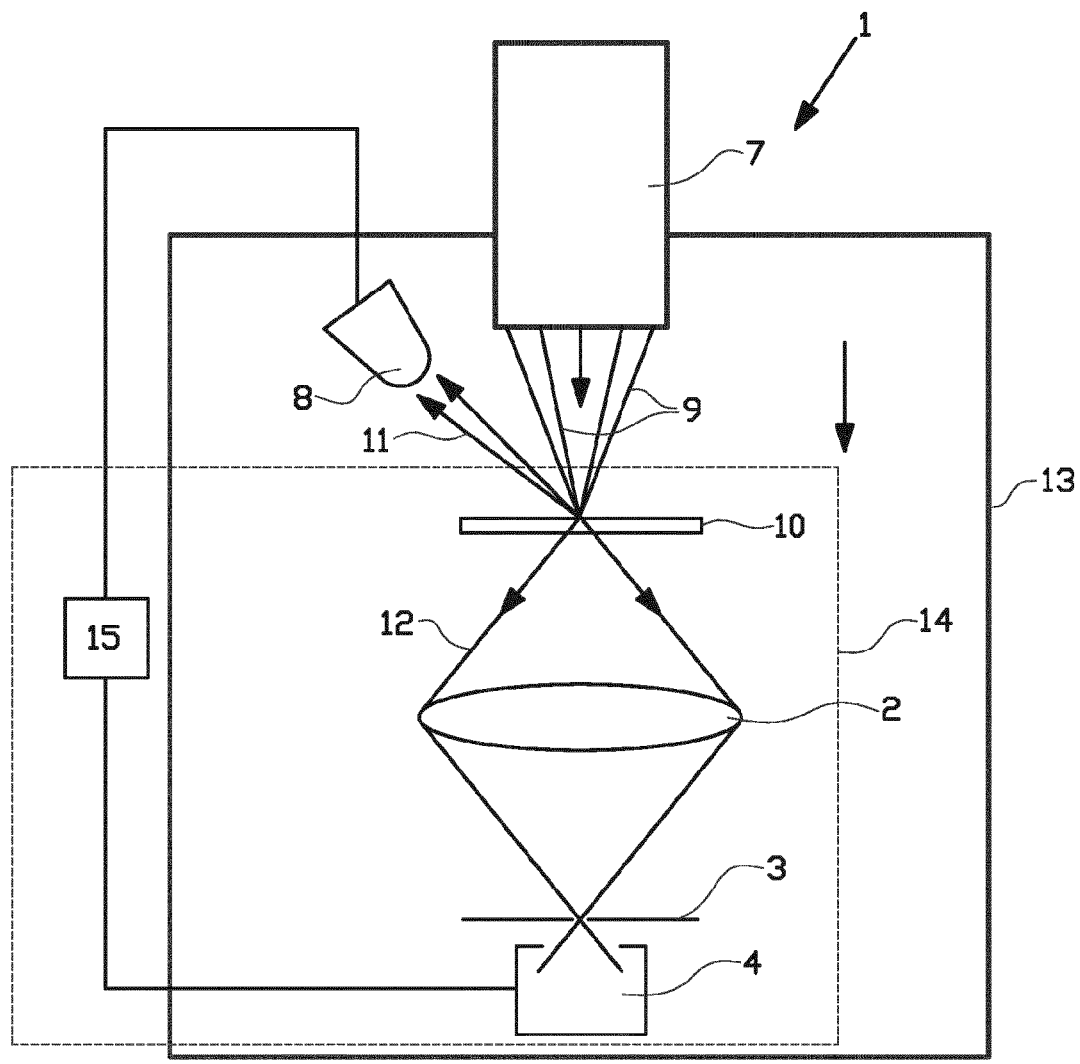
FIGS. 1A and 1B schematically depict basic designs of an apparatus as typically improved by the present invention.

By way of exemplifying a typical context of the present invention, a principle and relatively simple set up of a so-called optical SEM combination as known from the prior art will be provided. This example however by no means excludes any known or yet unknown variation or alternative thereof. Hence, with reference first to FIG. 1, the basic design of a first example of an inspection apparatus 1 of the invention is explained. It comprises in combination at least an optical microscope 2, 3, 4 and a charged particle microscope 7, 8, such as an ion- or electron microscope.

The charged particle microscope 7, 8 comprises a source 7 for emitting a primary beam 9 of charged particles to a sample 10 supported by a substrate included in a sample holder. The apparatus comprises a detector 8 for detection of secondary charged particles 11 backscattered from the sample 10, or emitted, transmitted, or scattered from the sample 10 and possibly induced by the primary beam 9. The charged particle microscope 7, 8 is substantially arranged inside a vacuum chamber 13.

The optical microscope 2, 3, 4 is equipped with an light collecting device 2 to receive in use luminescence light 12 emitted by the sample 10 and induced by the primary beam 9 of radiation and to focus it on a photon-detector 4. The light collecting device 2 may be an objective lens, a mirror or a glass fiber. It may also consist of a plurality of devices to arrange for collecting and focusing of the concerning luminescence light that is emitted by the sample 10, e.g. using a known per se CCD camera. In the present example the optical microscope 2, 3, is of an confocal type having a pinhole 3 between the light collecting device 2 and the photon detector 4. The optical microscope 2, 3, 4 is placed entirely inside the vacuum chamber 13 of the charged particle microscope 7, 8.

The closed dashed line 14 encircles those parts of the inspection apparatus 1 of the invention that may all or some of them be mounted on a (replaceable) door of the vacuum chamber 13. In particular, the sample holder for the sample 10, the light collecting device 2, the optional pinhole 3, and the photon-detector 4, are preferably mounted on said door of the vacuum chamber 13. This particular construction enables an easy retrofit or completion of an existing charged particle microscope according to prior art in order to convert it into an inspection apparatus according of the integrated type as is subject to the present invention.

In FIG. 1, a processing unit 30, alternatively denoted controller, is provided and useable as an automation unit, e.g. in the form of a computer, including a personal computer provided with dedicated software, implementing one or more methods of use of the inspection apparatus. The controller 15 may typically be provided with one or more screens, e.g. one screen or screen part for depicting the recorded optical image, and the other or another part of the same screen depicting an image, in particular of the same object, i.e. substrate, recorded via the charged particle part of the inspection apparatus. Each of these images are in the known inspection apparatuses provided with their own coordinate system. In the known inspection apparatuses, e.g. as described above, the primary beam may influence luminescence light, emitted by a scanned part of the substrate.

Figure 1B:
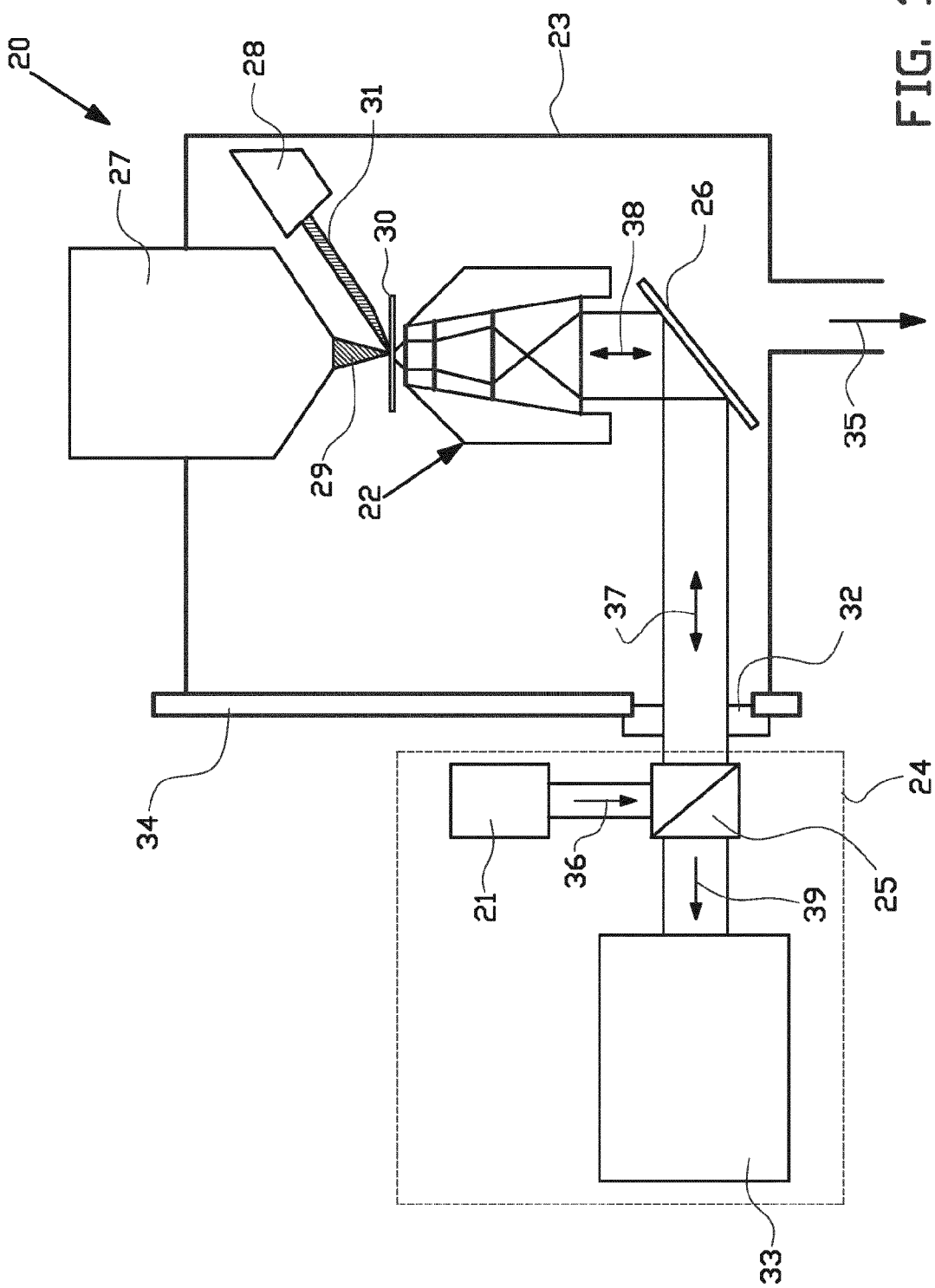

FIG. 1B a second example of an integrated system is presented, in particular without a confocal detection system, in which the present invention may be applied. The integrated system of this second example comprises a Scanning Electron Microscope (SEM) 27 comprising a vacuum chamber 23 which is connected to a vacuum pump via a connector 35. Inside said vacuum chamber 23, a sample 30 is arranged, which sample 30 can be irradiated with an electron beam 29. Secondary electrons 31 backscattered from the sample 30, or emitted, transmitted, or scattered from the sample are detected by a detector 28.

Below the sample 30 a microscope objective 22 is arranged inside the vacuum chamber 23, which is part of the light optical microscope system. The other major parts of the light optical microscope system are arranged outside the vacuum chamber 23 in an illumination and detection box 24. The illumination and detection box 24 which comprises a light source 21, for example a LED. The emitted light 36 from the light source 21 is directed out of the illumination and detection box 24 via a half transparent mirror or dichroic 25 and is directed into the vacuum chamber 23 via a window 32. This light 37, 38 is coupled into the microscope objective 22 via a mirror 26, for illuminating the sample 30. Light 37, 38 from the sample 30 is collected by the microscope objective 22 and is directed via the mirror 26 and the window 32 towards the illumination and detection box 24, and is imaged 39 via the half transparent mirror or dichroic 25 onto a camera 33, for example a CCD detector.

As shown in FIG. 1B, the light beams for illuminating and imaging the sample 30 enter into and passed from the vacuum chamber 23 via a window 32 which in this example is arranged in a door 34 of said vacuum chamber 23. The illumination and detection box 24 of the light optical microscope system is arranged outside vacuum chamber 23 and may be attached to the outside of the door 34. However, the illumination and detection part of the light optical microscope system may as well be included fully inside, e.g. attached to a bottom part, of the vacuum chamber 23.

Clearly, the illumination and detection box 24 may be configured in other manners and may comprise any kind of microscope, including e.g. cathodoluminescence microscope, laser confocal scanning microscope and wide field microscope. In addition the camera 33 can be replace by an other type of detector, such as a photodiode or a photomultiplier which measures the light intensity originating from a spot in the image. When using such as spot measuring detector to measure the light intensity from various spots on the sample 30 by scanning over the sample 30, the combination of such point to point measurements can provide an image of the sample 30.

Improved Optical SEM Inspection Apparatus

FIG. 2 illustrates the method according to the present invention involving scanning the electron beam over a substrate, detecting the light generated in the substrate, in particular as created through scanning thereof by the electron beam of an integrated SEM microscope, and building up a picture of the light intensity detected per scanned pixel. The spatial intensity distribution of the light collection efficiency of the light optical system is used to determine the spatial position of the light optical center in respect to the electron optical image. By moving the light optical system in x and/or y direction the image can be aligned. By observing the shape of the distribution of the light collection efficiency, the optical axes of both systems can be fully aligned through tilting and yawing the light optical system.

Figure 2A:
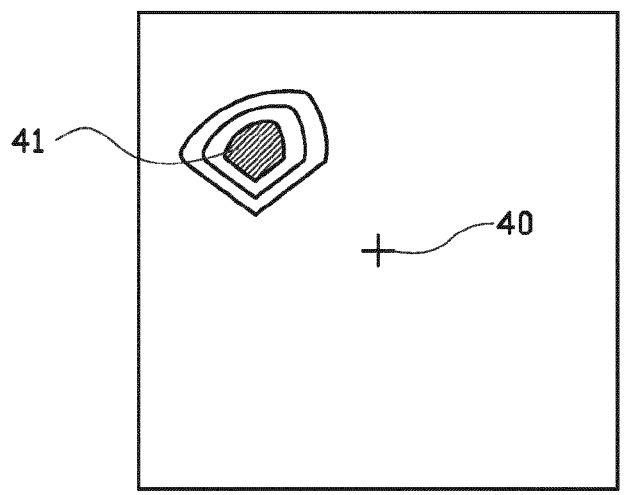
FIGS. 2A-2C illustrates a mutual alignment solution involving collection of an intensity profile of the light optical system.
Figure 2B:
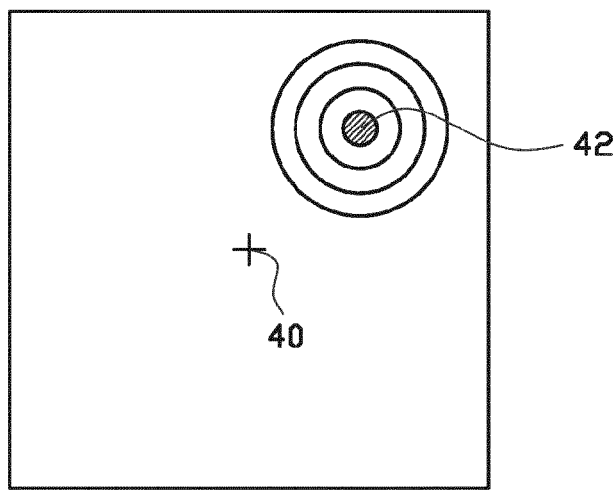
Figure 2C:
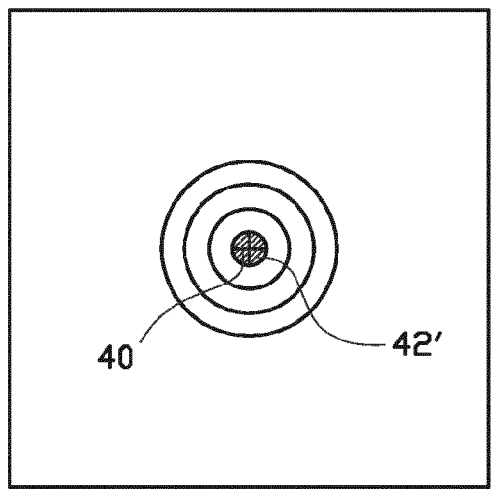

In the preceding respect, FIGS. 2A to 2C represent an image part in an X-Y plane as scanned by the beam of the electron optical system (EOS), the centre location thereof represented by a central cross 40 in said area. In the left upper part of this area in FIG. 2A is represented an irregular picture 41, and in FIG. 2B a regular picture 42 of the light intensity of the scanned area as detected by the light optical system (LOS), a so called intensity profile. The centre area of said intensity profile 41, 42 represents the maximum, virtually 100% as it were, representing the part that is normally used to image the substrate. This part, at least this identified area is also the area used to identify the position of the LOS relative to the EOS, in particular the electron beam thereof. Where this area would not be circular as in the example if FIG. 2A, the irregular shape 41 is known in advance, so that the center thereof can be calibrated, at least can be determined in advance. In FIG. 2C the light optical system is moved to the centre of the scanned area, the centre location 40 and the regular picture 42' of the light intensity of the scanned area substantially overlap, so that the electron optical system may zoom into the centre of the light optical system, for accurate alignment.

The total amount of light detected during a scan can also be used to position the light optical system in focus (z-direction) of the substrate. The position where the most light is detected is the focus position. This can be done by moving the last optical detection element that images the substrate manually or by an electronically controlled alignment mechanism. The latter can be done by an automated computer control that can detect the intensity profiles and move the light optical elements.

Figure 3A:
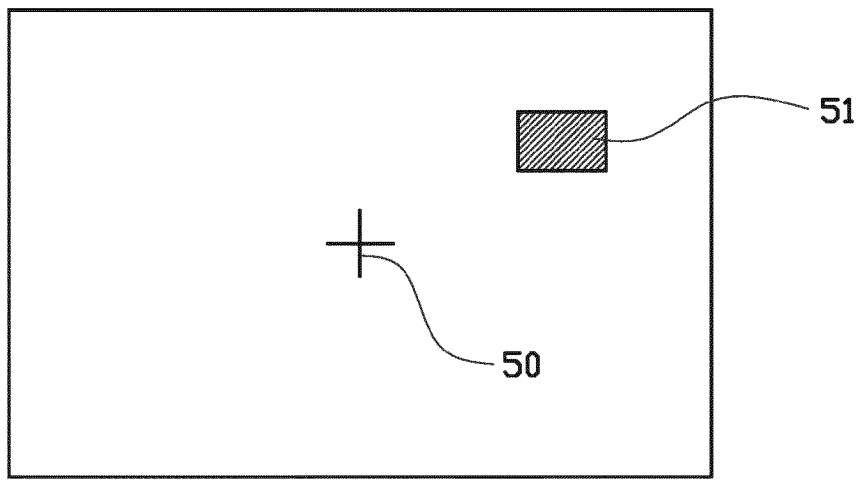
FIGS. 3A and 3B illustrate a first mutual alignment solution measuring deflection settings of the SEM system.
Figure 3B:
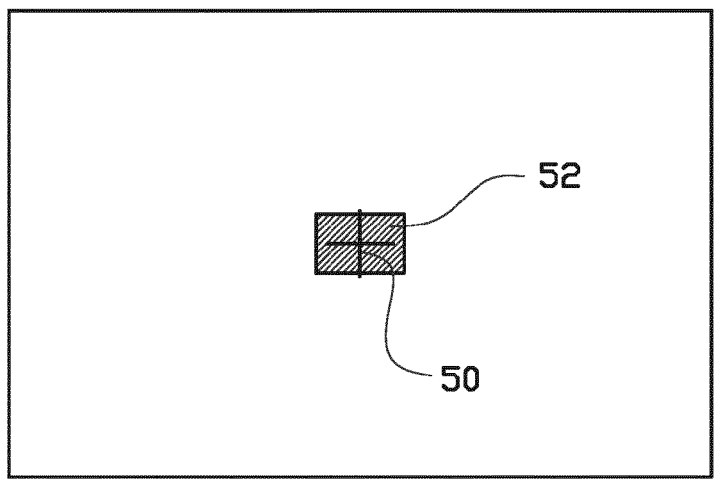

FIGS. 3A and 3B illustrate an alternative implementation of the method according to the present invention. The FIGS. 3A and 3B represent the X-Y plane of the light optical field of view as imaged for instance with a pixelated camera. Here the light intensity generated by an electron beam is measured for each pixel in the light optical image. The electron beam is scanned over the substrate in a pattern 51, such as indicated by the hatched rectangle in FIG. 3A. The acquisition time of one light image should at least be equal to one scan frame time of the electron microscope. By comparison of the known size of the scan area to the pattern 51 visible in the wide field light optical image, the position of the electron beam axis can be correlated to the center 50 of the optical image. By moving the light optical system both systems can be aligned in a single step so that the pattern 52 overlaps with the center 50 of the optical image (FIG. 3B). This can be done by automated computer control.

Figure 4A:
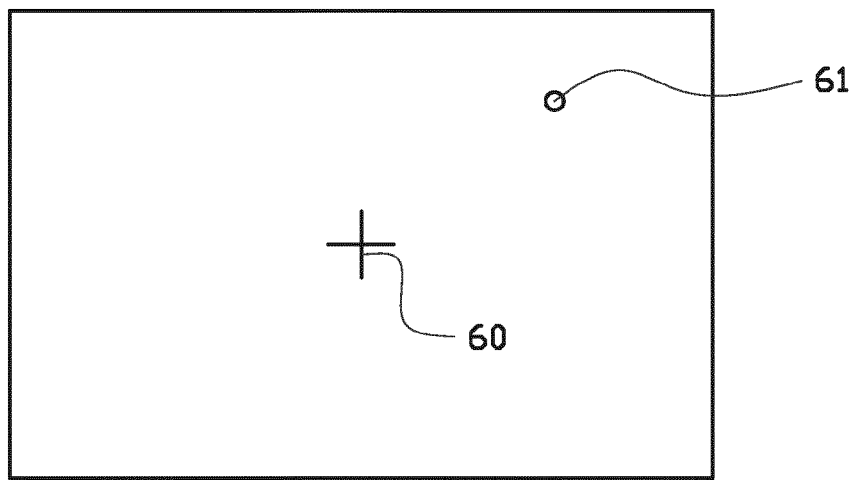
FIGS. 4A and 4B illustrate a second mutual alignment solution measuring deflection settings of the SEM system.
Figure 4B:
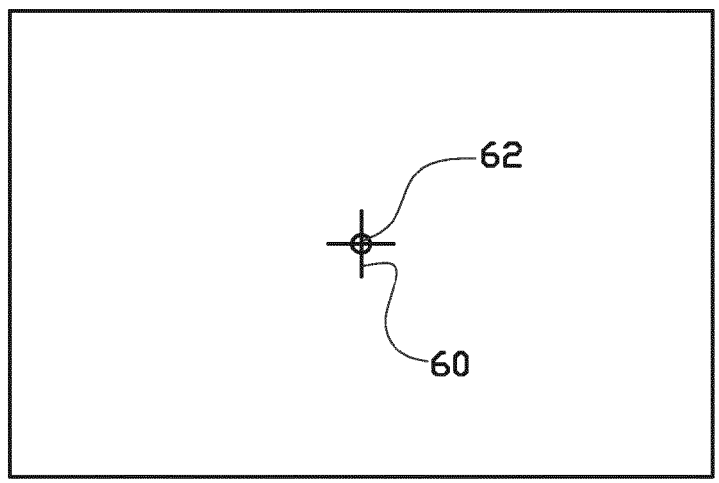

The electron beam can also be at a fixed position which results in a circular spot 61 in the light optical image, as indicated by the hatched spot in FIG. 4A. The center of this spot 61 corresponds to the position of the electron beam and the position of the electron beam axis can be determined from the deflection settings of the SEM or other type of charged particle microscope. By moving the light optical system both systems can be aligned in a single step so that the pattern 62 overlaps with the center 60 of the optical image (FIG. 4B). Again, this can be done by automated computer control.

Figure 5:
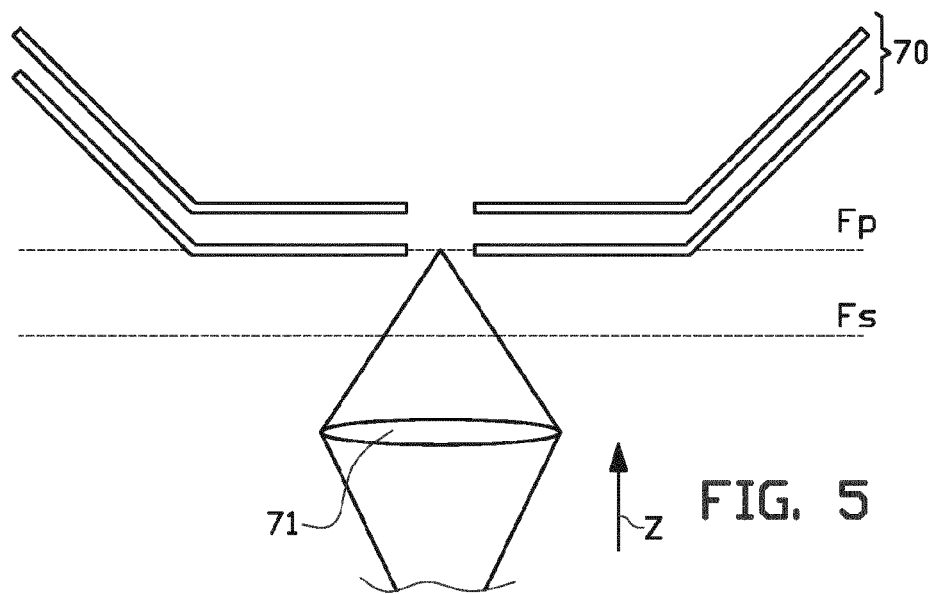
FIG. 5 illustrates a mutual alignment solution in which a SEM image of the final light objective lens is taken, preferably with the substrate removed.

FIG. 5 illustrates a solution involving pole-piece imaging. In this solution, the light objective lens 71, i.e. the last lens that normally images the sample, can be moved up in z direction. This light objective lens 71 is then focused on the pole piece 70 position marked Fp in the FIG. 5. Thus the light optical microscope images a part of the last lens of the electron microscope, in particular the plane Fp of the pole piece 70, instead on the substrate plane marked Fs in the FIG. 5. Thus, the position of the electron optical axis is determined, i.e. the center of the opening in the pole piece 70. By moving the light optical system in at least x, y, preferably also tilt and yaw, the optical axis of the light optical microscope can be aligned with the optical axis of the electron microscope. This can be done by an automated computer control that can detect the center of the electron lens 70 and move the light optical elements 71. After alignment the last optical lens 71 will be moved down in only z to position it back in the focus position of the normal sample.

Figure 6:
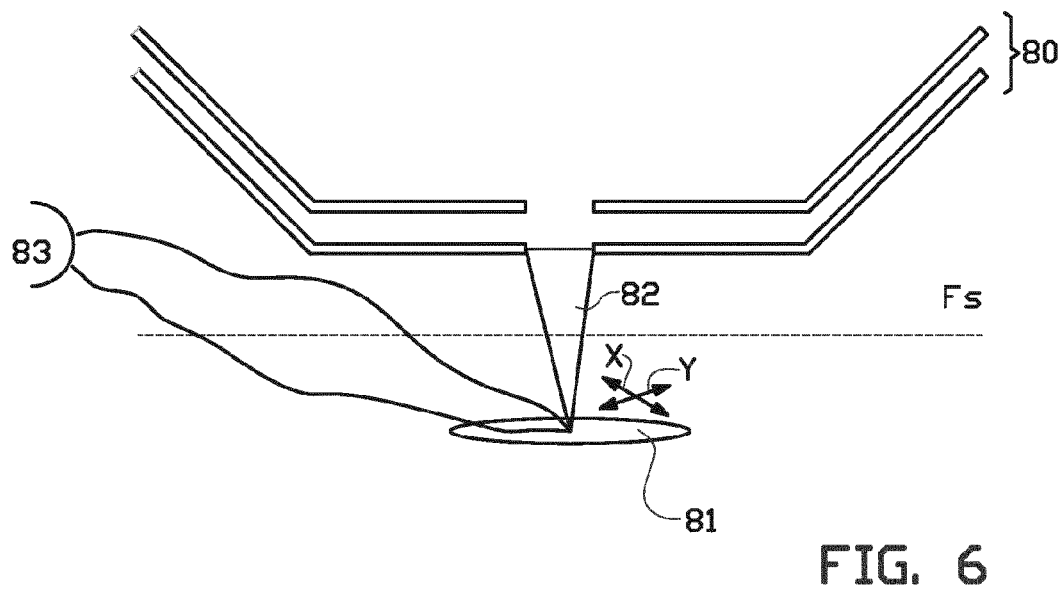
FIG. 6 illustrates a mutual alignment solution involving pole piece imaging.

FIG. 6 illustrates a solution involving a SEM image of the light objective lens 81. This is done by removing the sample at position Fs, which sample is normally the object of study by the electron microscope and light microscope. The electron microscope 80 is then used to image the last optical element 81 of the optical system, by illuminating the light objective lens 81 with an electron beam 82 and detecting the secondary electrons by a detector. After imaging the last element 81 of the optical system with the electron microscope the misalignment of the optical systems is determined. By moving the light optical system in at least X, Y, preferably also in Z and tilt and yaw, both optical axes can be aligned on each other.

By placing a marker pattern on the last optical element 81 that can be detected with the electron microscope 80 the misalignment can be determined. This can all be done by an automated computer control 83 that can detect the center of the electron beam 82 and move the light optical elements 81.

Figure 7:
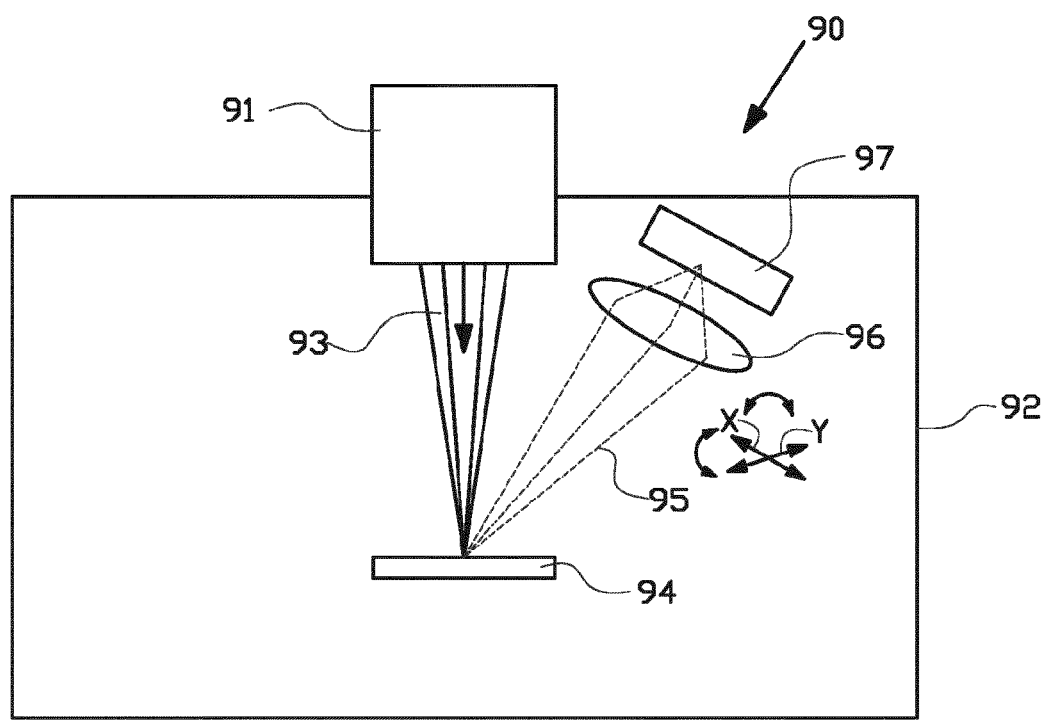
FIG. 7 illustrates an alternative configuration of an integrated microscope.

Further to the solutions provided, it is submitted that these are developed in view of one possible application involving retrofitting a conventional electron optical inspection system, with the aim of not having to modify the Electron Microscope System (SEM). Rather, use is made of a stage carrying an Optical Microscope System, at least partly included in the vacuum space of the SEM system, preferably mounted to the inner door side and replacing an originally stage in the form of a substrate or sample holding mount, e.g. as known from patent publication WO2012008836. The present invention allows simultaneous inspection of exactly the same part of a sample without the need of defining and retrieving, i.e. finding back a so called region of interest (ROI). The above presented alignment solutions may be executed either manually or automated, which latter is particularly desired when moving in Z, i.e. vertical direction, when very small and accurate steps are required for purposes of finding a focal level. The present invention may however as well be applied in an originally integrated design where e.g. the light optical system is fully incorporated in the vacuum housing of the inspection system, typically right under the electron optical column and attached to bottom part of the housing, rather than to an e.g. replaced door thereof as for example shown in FIGS. 8, 9 and 10 as discussed in more detail below. However, as shown in FIG. 7, the light optics 96, 97, while maintaining the principle of alignment according to the invention, may also be included at other locations, e.g. to the upper side of the substrate 94 inside the vacuum chamber 92, or e.g. more or less sideways inside or outside thereof using holed, possibly curved mirror. Thus the SEM provides an electron beam 93 for scanning the sample 94, and light 95 originating from the region scanned by the electron beam 93 is detected by the sensor 97. By using the method of the invention, the optical components, in particular the objective 96 can be moved (X, Y) in order to align the centre of the image area as detected by the sensor with the centre of the area scanned by the SEM.

Figure 8:
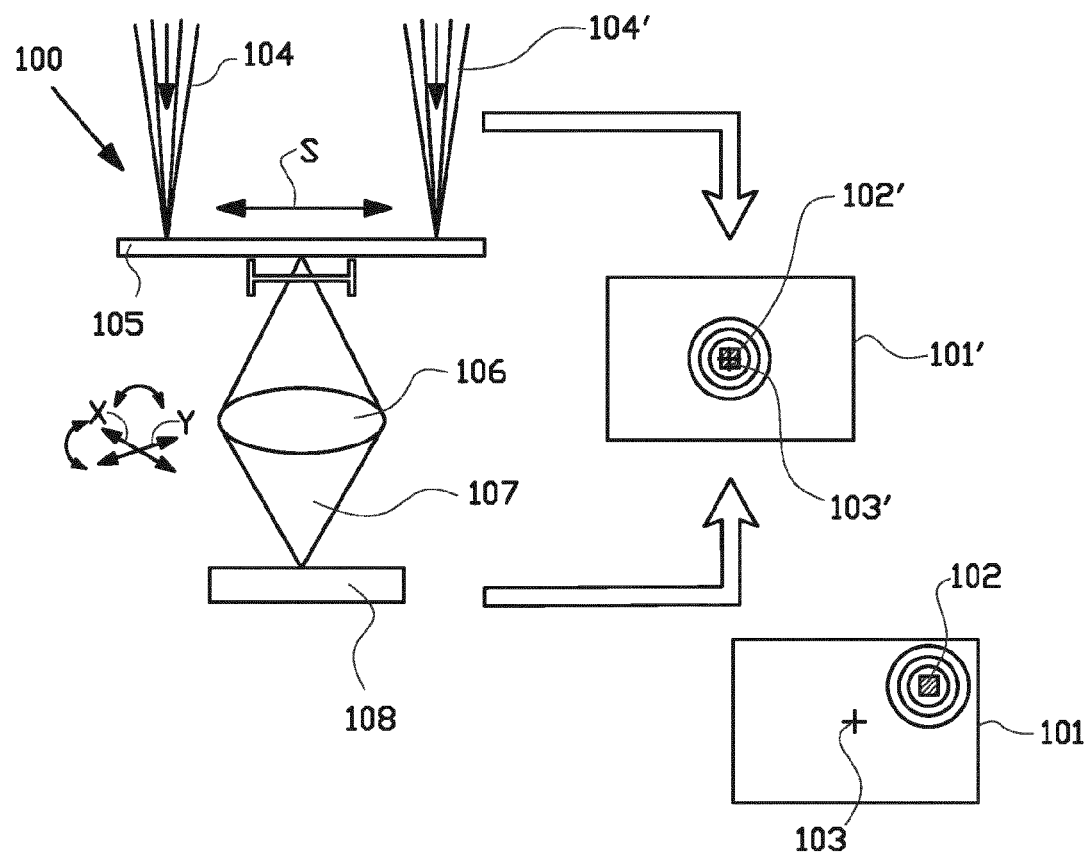
FIG. 8 is a further illustration of the alignment principle of FIG. 3, using a cathode-luminescence feature of a substrate scanned by the charged particle microscope.
Figure 9:
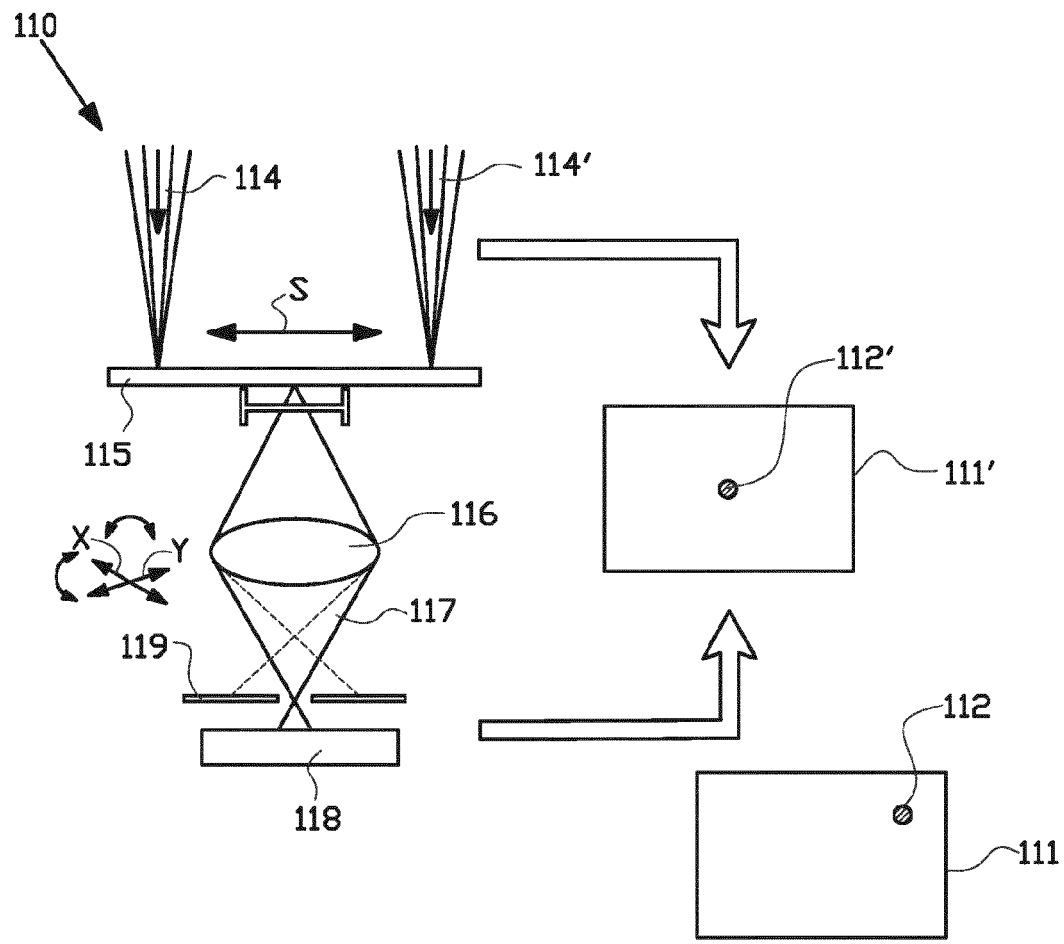
FIG. 9 represents a solution in conformance with FIG. 8 using a light microscope with confocal pinhole optical arrangement.
Figure 10:
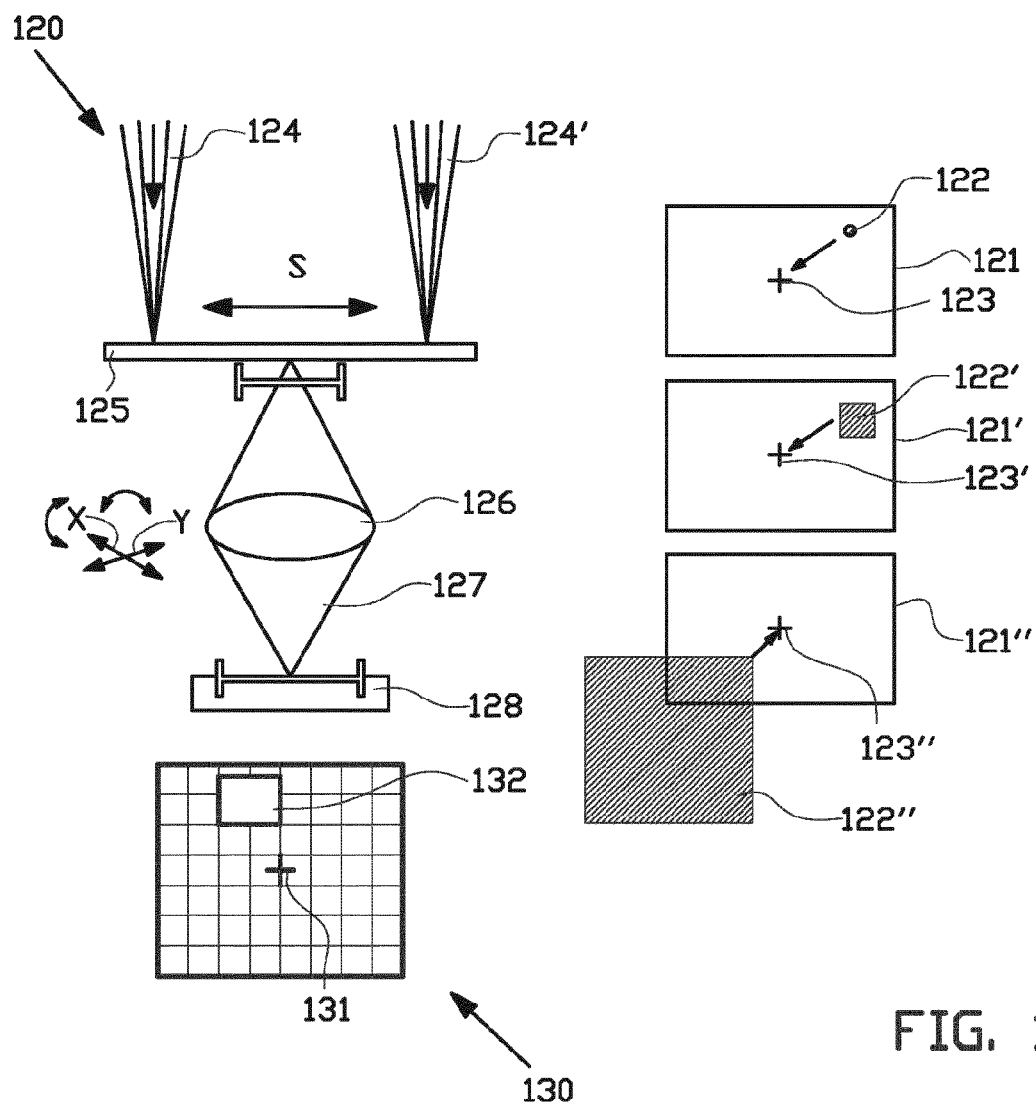
FIG. 10 represents an alternative embodiment of the alignment principle using a pixelated light detector such as CCD and CMOS.

FIGS. 8, 9 and 10, in different embodiments, illustrate the principle of FIG. 3 in combination with a schematic representation of the respective microscopes of the integrated system 100. In this respect, the square 102 at the lower right hand side of FIG. 8 represents a misaligned situation of the charged particle microscope and light microscope within a field of a substrate 101. The nested circles therein indicate the intensity profile of light 107 collected by the light optical microscope 106, 108, with the highest intensity at the centre thereof, representing the light optical microscope, and the central cross 103 representing the optical centre of the SEM or charged particle microscope system 104, 105. The position of the light optical centre is found by scanning S the charged particle beam 104, 104' over substrate 105 as is represented by two focused beam positions indicated in the upper part of FIG. 8, at the top side of a substrate 105. A final lens 106 of the light optical system is arranged at the bottom side of the substrate 105. The lens 106 focuses the light 107 received to a photon measuring device 108. The SEM scans the electron beam 104, 104' over a virtual grid on the sample 105, and the light intensity collected by the light optical system 106 is measured by the detecting device 108, such as a photo multiplier tube, for each grid position of the charged particle beam 104, 104'. It may be clear that the grid position with highest photon intensity represents the centre of the light optical system 106, 108. Once the location of the centre of the light optical system 106, 108 is known with respect to said virtual grid or coordinate system, the positions of the SEM and the optical microscope may correlated, and/or the SEM and the optical microscope may be relatively moved (X, Y) so as to arrive in alignment, such that in the field 101' on the substrate 105, the intensity profile 103' substantially coincides with the optical centre 103' of the SEM, Hence, using the existing grid of the charged particle scanning system, and the existing photon detection device of the light optical system, the two optical systems are highly accurately aligned using a presently proposed method of mutual position detection. Typically the scan area S of the SEM may be in the order of millimeters. At highest sensitivity of the light microscope, the sensitive area of the latter typically me be in the order of 20 by 20 micrometer. With the present method a typical pre-alignment accuracy in the order of magnitude of 0.5 nanometer may be attained.

FIG. 9 represents a corresponding set-up and method as described above with reference to FIG. 8, but now using a confocal configuration, in which a pinhole element 119 blocks all light beams 117 that are out of focus or laterally offset, i.e. in X-Y plane, so that the maximum field of view is limited. Although the intensity profile 112 of a confocal light optical system is relatively small, the method of correlating position or of alignment corresponds to the above described method. In this configuration both the pinhole 119 and/or the light optical system 116, 118 may be iteratively re-positioned at performing the otherwise corresponding alignment method.

In this respect, the circle 112 at the lower right hand side of FIG. 9 represents a misaligned situation of the charged particle microscope and light microscope within a field of a substrate 111. The position of the light optical centre is found by scanning S the charged particle beam 114, 114' over substrate 115 as is represented by two focused beam positions as shown in FIG. 9, at the top side of a substrate 115. A final lens 116 of the light optical system is arranged at the bottom side of the substrate 115. The lens 116 images the light 117 received from the sample 115 onto the pinhole element 119 and the light transmitted by the pinhole 119 is directed to a photon measuring device 118. The SEM scans the electron beam 114, 114' over a virtual grid on the sample 115, and the light intensity collected by the light optical system 116 and transmitted through said pinhole 119 is measured by the detecting device 118, such as a photo multiplier tube, for each grid position of the charged particle beam 114, 114'. Again, the grid position with highest photon intensity represents the centre of the light optical system 116, 117, 118. Once the location of the centre of the light optical system 116, 117, 118 is known with respect to said virtual grid or coordinate system, the positions of the SEM and the optical confocal microscope may correlated, and/or the SEM and the optical confocal microscope may be relatively moved (X, Y) so as to arrive in alignment, such that in the field 111' on the substrate 115, the intensity profile 113' substantially coincides with the optical centre 113' of the SEM, FIG. 10 the grid of a pixelated photon detector 128, 130, e.g. CCD and CMOS based, rather than that of the charged particle microscope is used for mutual correlation of the optical centre of the two microscopes. In this set up the optical field of view is fixed, and an optical image 121 is made in which the charged particle beam 124, 124' or area scanned S thereby is detected. The right hand side of the FIG. 10 illustrates three possible situations, with from top downwards represent:

first, a situation with a non-moving charged particle beam 122 located out of the centre 123 of the optical image 121. By moving the charged particle device 120 and the optical microscope 126, 128 with respect to each other in the direction of the arrow, the optical center of the charged particle device can be aligned with the center 123 of the optical image 121.

secondly, a situation wherein the charged particle beam scans a (hatched) scanned area 122' which is smaller than the area imaged by the optical image 121'. Again, by moving the charged particle device 120 and the optical microscope 126, 128 with respect to each other in the direction of the arrow, the optical center of the charged particle device can be aligned with the center 123' of the optical image 121'.

thirdly a situation wherein only part of a scanned area 122" by the charged particle beam is visible in the optical image 121". In this situation the known size of the scanned area 122" is used in combination with the size and location of the part within the optical image 121" is used for mutual correlation or for relatively moving the center of the scanned area 122", which may be outside area 121" imaged, to the center 123" of the optical image 121".

The image detection surface 130 with pixels of the pixelated photon detector 128 is schematically presented in the lower part of FIG. 10, and the center of the image field 130 is indicated by the cross 131. The image 132 of an area scanned by the charged particle beam is schematically indicated. Where the grid of the light detection system 130 may use alphanumeric position references, these may for ease of use, e.g. in case of manual displacement, as well be hard copied in the detection element.

In summary, with the measures according to the present invention, highly accurate dynamic positioning of the optical microscope in a standard SEM is made possible. The optical microscope can be translated in-situ below the sample stage during SEM operation in sub-micrometer steps. For proper alignment, the cathodoluminescence signal from a glass slide without sample is used to correlate the electron beam image center and light optical axis. The alignment method according to the present invention can align the objective of the light optical microscope to within 1 µm of the electron image field of view when needed, as experienced in a practiced embodiment. A large field of view of the SEM is therein exploited to determine the optical axis by measuring the collection efficiency. If needed, any remaining discrepancy between the centers of the field of view of both microscopes can be fine-tuned by electronically shifting the electron beam. After the alignment procedure, simultaneous imaging and overlay is now possible on the same region of interest. Where the light optical part of the system may be setup as a fluorescence light microscope, other modalities such as confocal laser scanning, cathode luminesce detection and super resolution modes can be incorporated instead with relative ease. It may be clear from the preceding that the presently proposed invention enables true simultaneous integrated correlative microscopy.

It is finally remarked that alternatively the electron optical system or both could be moved rather than the light system only for realizing relative movement of the two optical systems. It may be clear however that especially in cases of retrofit systems, the light optical system to be added can more easily be adapted an taken responsibility for said relative movement. In particular in case of originally designed equipment however, EOS, i.e. the electron optical column thereof may be moved relative to the light optical system for realizing the mentioned relative movement.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Method for mutually aligning a scanning electron microscope SEM and a light microscope LM by
   creating a change in the detected light signal of the light microscope LM by illuminating a substrate with an electron beam;
   correlating the position of the electron beam in the coordinate system of the scanning electron microscope SEM to the position of the observed change in the detected light signal in the coordinate system of the light microscope LM;
   relatively shifting the scanning electron microscope SEM and the light microscope LM with respect to one another to a desired relative position of the coordinate systems.

2. Method according to claim 1, wherein the objective lens of either one of the scanning electron microscope SEM and the light microscope LM is shifted, while the objective lens of the other system is maintained in its position.

3. Method according to claim 1, wherein said correlation comprises the steps of making an image in which the X and Y is related to the electron beam and the signal is obtained from the light microscope LM.

4. Method of aligning the optical centres of a charged particle optical inspection system and a light optical inspection system in an integrated inspection system comprising said charged particle and said light optical system for combined and preferably simultaneous inspection of a substrate, the method thereto comprising the steps of identifying and correlating the centre of the respective optical systems by imaging either system via a substrate, and mutually correlating the optical axes of the two systems in a common coordinate system, the method further comprising the steps of:
   generating a picture of the light intensity detected per scanned pixel in a grid correlated to either of the two optical systems;
   using a spatial intensity distribution in said picture of the light collection efficiency of the light optical system to determine the spatial position of the optical axis of the light optical inspection system in respect to the optical axis of the charged particle optical inspection system.

5. Method according to claim 1, wherein the optical microscope is included in vacuum, in particular in the vacuum space of the charged particle microscope.

6. Method according to claim 1, wherein the light optical system is of the confocal type having a pinhole element in front of the light detection element, and wherein the method further comprising the steps of
   correlating the portion of the electron beam in the coordinate system of the scanning charged particle microscope and/or the light microscope to the observed change in detected light signal as a consequence of the position of the pinhole,
   shifting the pinhole with respect to the charged particle and/or the light microscope to a desired position.

7. Method according to claim 1, wherein an optical image is made in which a charged particle beam or an area scanned thereby is detected, in particular using a fixed optical field of view.

8. Method according to Method according to claim 1, wherein calibration of the integrated system, at least mutual position detection and relative displacement of the two microscopes is performed using an automated control system.

9. Method according to claim 1, wherein mutual position detection is realized using a cathodoluminescence feature of a substrate.

10. Method according to claim 1, wherein the shape and/or size of a light intensity profile is used for determining one or more of a position in Z-direction, an amount of Yaw and an amount of tilt.

11. Method according to claim 1, wherein one of a charged particle microscope and a light microscope lens is directly imaged by the other microscope.

12. Method according to claim 1, in which the respective axes of the light and electron optical apparatus are aligned on each other by relative tilt and yaw of the either or both of the optical axes, based on the nature of the intensity distribution.

13. Method according to claim 1, in which the respective optical axes of the inspection apparatuses are aligned by movement of the final optical detection element that images the substrate, either manually or automated using an electronically controlled alignment mechanism.

14. Method according to claim 1, in which the method comprises the step of detecting light generated in the substrate using a cathodoluminescence feature thereof.

15. Method according to claim 1, in which the total amount of light detected during a scan is used to position the light optical system in focus of the substrate.

16. Method according to claim 1, in which the light optical elements are moved to the optical axis of the electron beam.

17. Apparatus for inspecting a sample, provided with a charged particle microscope having a column for producing a focused beam of charged particles to observe or modify the sample, and an optical microscope to observe a region of interest on the sample as is observed by the charged particle beam or vice versa, the apparatus accommodated with a detection and processing unit adapted and for performing a substrate scanning action for mutual correlation of the respective optical centre of the light and charged particle optical system, in which said adaptation comprises the performance of a relative movement of either or both of the optical systems such that the optical centres are aligned.

18. Apparatus for inspecting a sample, provided with a charged particle microscope having a column for producing a focused beam of charged particles to observe or modify the sample, and an optical microscope to observe a region of interest on the sample as is observed by the charged particle beam or vice versa, the apparatus accommodated with a detection and processing unit adapted and for performing a substrate scanning action for mutual correlation of the respective optical centre of the light and charged particle optical system, in which a pinhole element is incorporated moveably in front of the final lens of the optical microscope.

* * * * *